(12) United States Patent
Chang et al.

(10) Patent No.: US 8,690,271 B1
(45) Date of Patent: Apr. 8, 2014

(54) DETACHABLE INNER SLIDING RAIL AND SERVER CASE MOUNTING ARRANGEMENT

(71) Applicant: GSLIDE Corporation, New Taipei (TW)

(72) Inventors: Te-Jeng Chang, New Taipei (TW); Sung-Mu Chiang, New Taipei (TW)

(73) Assignee: Gslide Corporation, Taipei Hsien (TW)

( * ) Notice: Subject to any disclaimer, the term of this patent is extended or adjusted under 35 U.S.C. 154(b) by 0 days.

(21) Appl. No.: 13/761,303

(22) Filed: Feb. 7, 2013

(51) Int. Cl.
*A47B 88/00* (2006.01)

(52) U.S. Cl.
USPC ............ 312/334.46; 312/333; 248/298.1; 248/424

(58) Field of Classification Search
USPC ............ 248/222.41, 223.21, 298.1, 424; 312/333, 334.44–334.47, 334.11; 384/21, 22
See application file for complete search history.

(56) References Cited

U.S. PATENT DOCUMENTS

| | | | | |
|---|---|---|---|---|
| 6,390,575 B1 * | 5/2002 | Chen et al. | ............. | 312/334.46 |
| 7,467,833 B2 * | 12/2008 | Weng | ............. | 312/221 |
| 7,520,577 B2 * | 4/2009 | Chen et al. | ............. | 312/334.46 |
| 8,534,782 B2 * | 9/2013 | Yu et al. | ............. | 312/333 |
| 8,585,166 B2 * | 11/2013 | Chen et al. | ............. | 312/334.46 |
| 2002/0175605 A1 * | 11/2002 | Chen et al. | ............. | 312/333 |
| 2007/0108880 A1 * | 5/2007 | Lu | ............. | 312/334.11 |
| 2009/0072689 A1 * | 3/2009 | Yang et al. | ............. | 312/333 |

* cited by examiner

*Primary Examiner* — Gwendolyn Baxter
(74) *Attorney, Agent, or Firm* — Cook Alex Ltd.

(57) ABSTRACT

A detachable inner sliding rail and server case mounting arrangement includes a server case having a plurality of hangers arranged in a line at one side thereof, each hanger defining a shank and a head, an inner sliding rail having a plurality of hanger holes spaced along the length thereof for hanging to the hangers of the server case, each hanger hole defining a large hole for the passing of the head of one respective hanger and a narrow slot for engagement with the shank of one respective hanger after insertion of the heads of the hangers through the large holes of the respective hanger holes and a horizontal displacement of the inner sliding rail relative to the server case, a spring plate affixed to the inner sliding rail adjacent to one hanger hole, and a stop member pivotally coupled to the spring plate.

4 Claims, 10 Drawing Sheets

DETACHABLE INNER SLIDING RAIL AND SERVER CASE MOUNTING ARRANGEMENT

BACKGROUND OF THE INVENTION

1. Field of the Invention

The present invention relates to server mounting technology and more particularly, to a detachable inner sliding rail and server case mounting arrangement, which allows an inner sliding rail to be easily mounted at and dismounted from a server case with less effort and without tools.

2. Description of the Related Art

Figure 1:
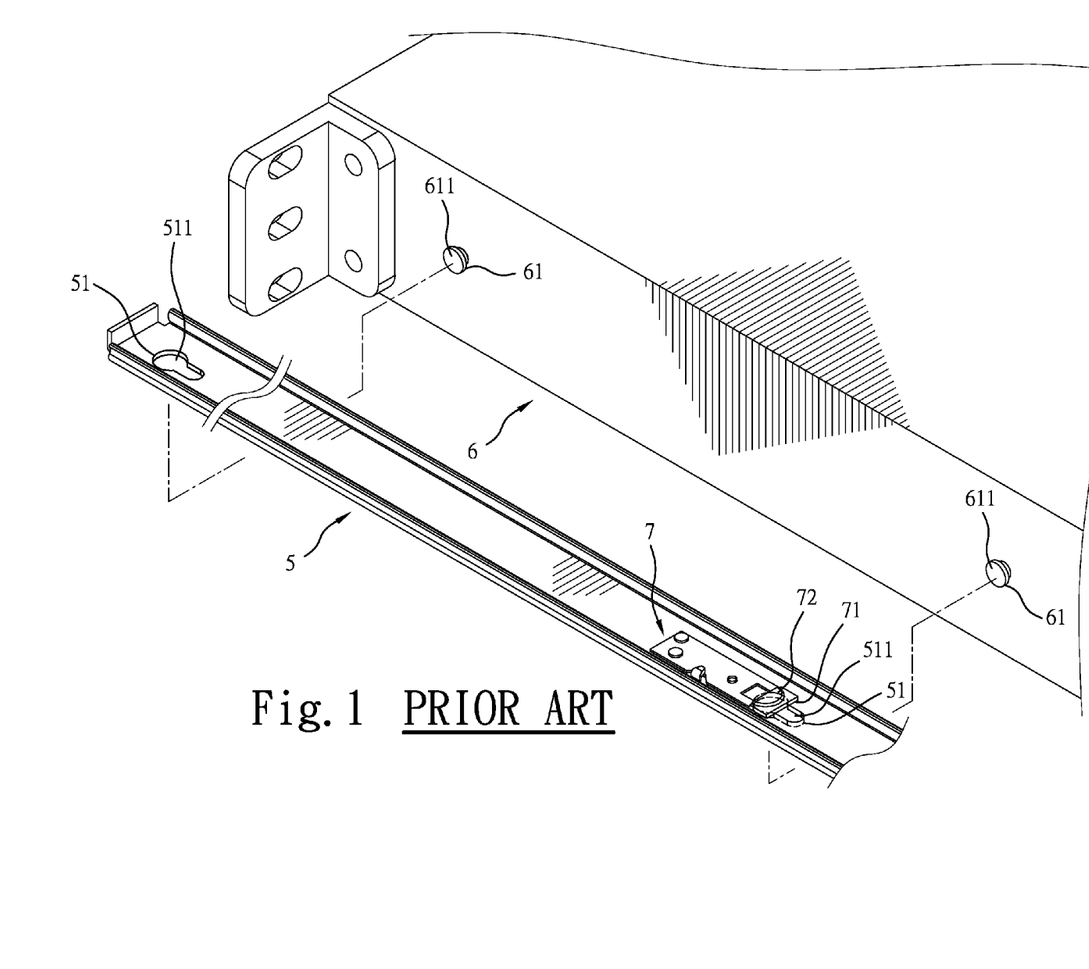
FIG. 1 is an exploded view of a detachable inner sliding rail and server case mounting arrangement according to the prior art.
Figure 2:
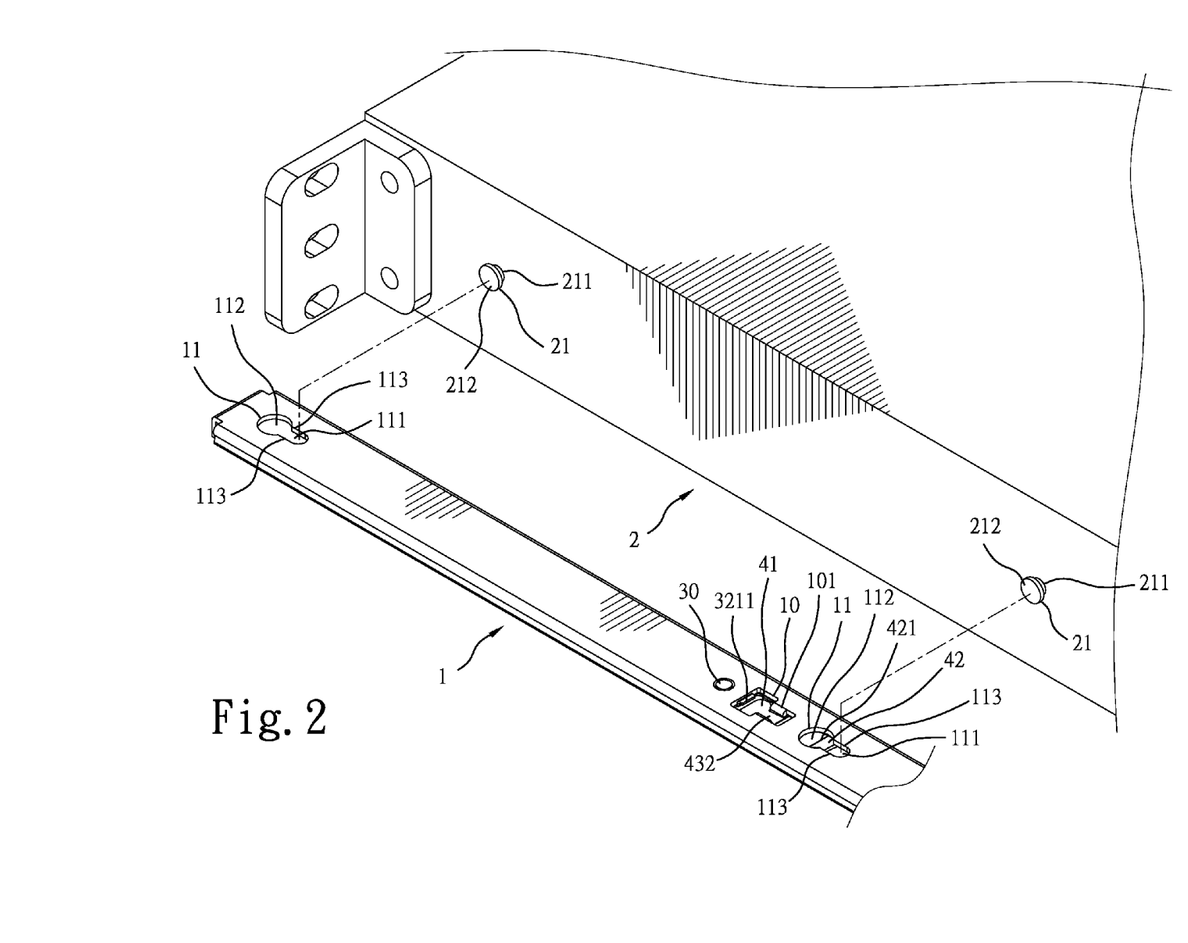
FIG. 2 is an exploded view of a detachable inner sliding rail and server case mounting arrangement in accordance with the present invention.
Figure 3:
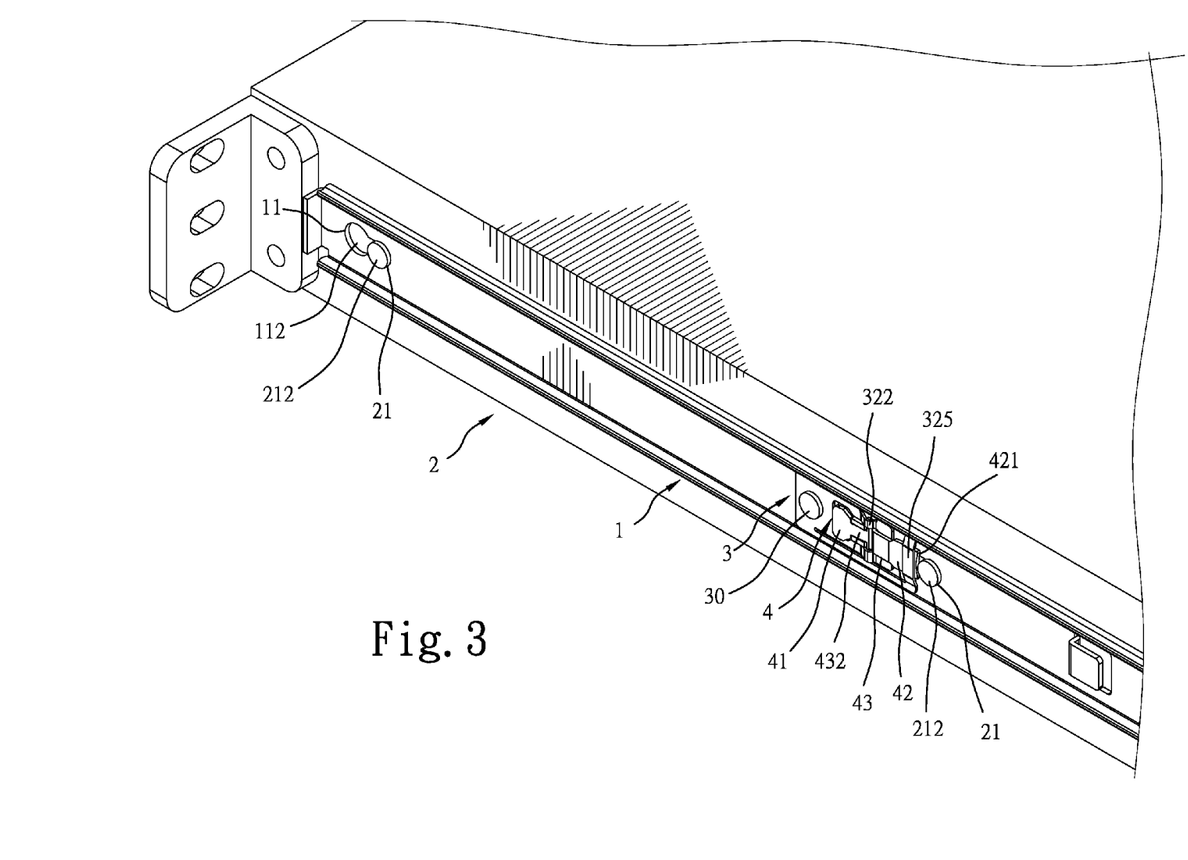
FIG. 3 is an elevational assembly view of the detachable inner sliding rail and server case mounting arrangement in accordance with the present invention.
Figure 4:
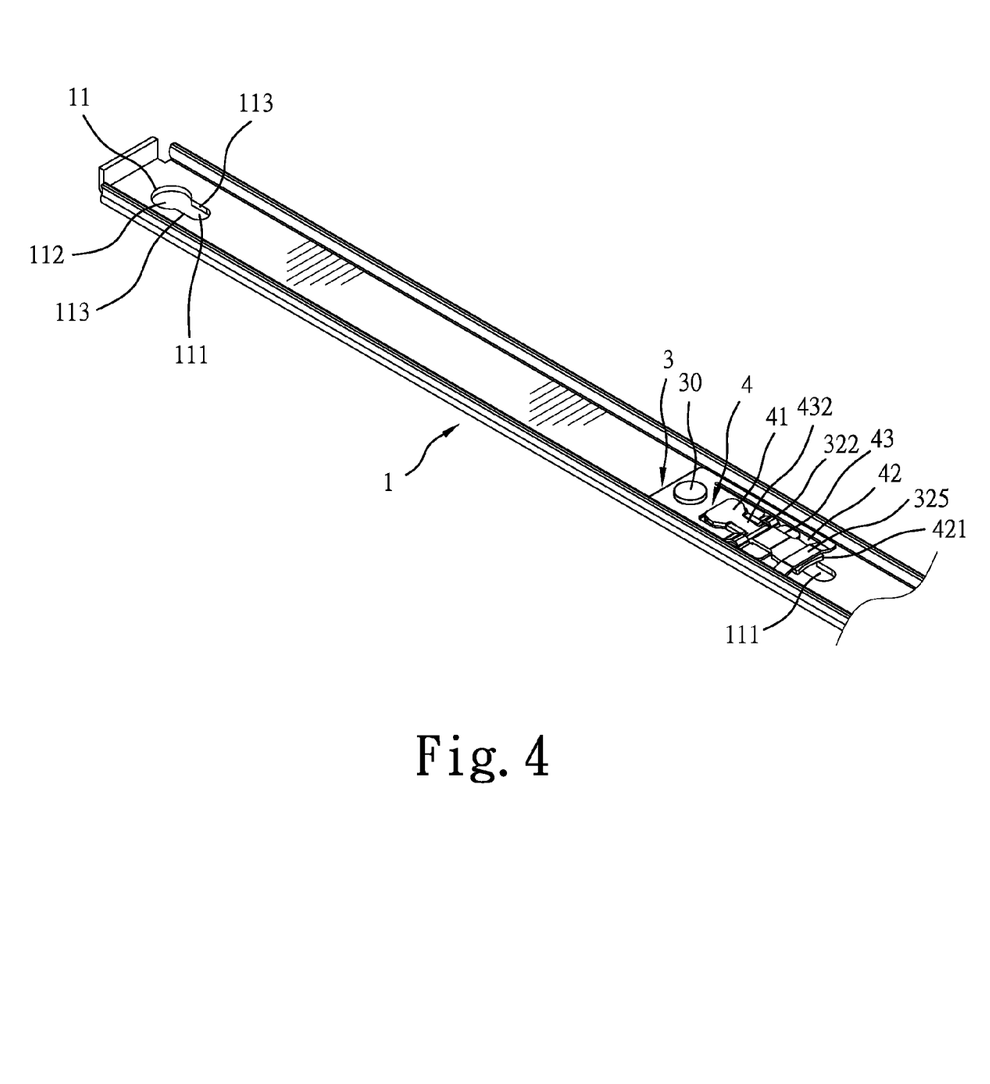
FIG. 4 is an elevational assembly view of a part of the present invention, illustrating the spring plate and the stop member installed in the inner sliding rail.
Figure 5:
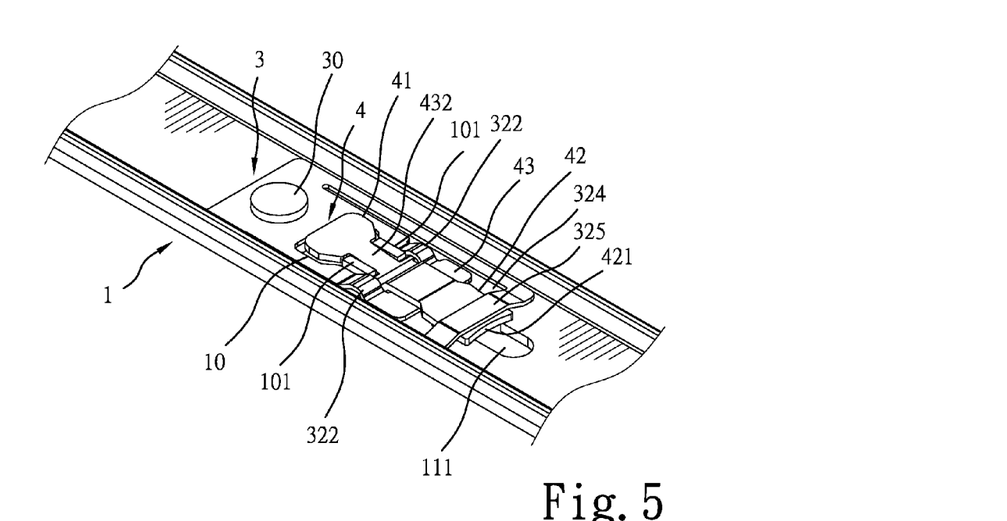
FIG. 5 is an enlarged view of a part of FIG. 4.

A server case has an inner sliding rail mounted at each of two opposite lateral sidewalls thereof for the mounting of one respective outer sliding rail at a server rack. FIG. 1 illustrates a prior art mounting arrangement between an inner sliding rail 5 and a server case 6. During installation, attach large holes 511 of keyhole-shaped hanger holes 51 of the inner sliding rail 5 to heads 611 of hangers 61 at the server case 6, and then move the inner sliding rail 5 horizontally relative to the server case 6 to let the inner sliding rail 5 to be stopped in place by the heads 611 of hangers 61. At this time, a stop portion 71 of a spring plate 7, which is affixed to the inner sliding rail 5 adjacent to one hanger hole 51, is abutted against the head 611 of one hanger 61 to prevent horizontal displacement of the inner sliding rail 5 relative to the server case 6. However, when the user needs to detach the inner sliding rail 5 from the server case 6 in order to perform a repair or maintenance work, the user must use a screwdriver or other tool to lift the stop portion 71 of a spring plate 7 from the head 611 of the respective hanger 61 for allowing the inner sliding rail 5 to be moved horizontally relative to the server case 6. If no tool is available, the user must the fingers to lift the stop portion 71 or other part 72 of the spring plate 7 and to further disengage the spring plate 7 from the head 611 of the respective hanger 61. It is inconvenient and requires much effort to disengage the spring plate 7 from the head 611 of the respective hanger 61 by fingers.

SUMMARY OF THE INVENTION

The present invention has been accomplished under the circumstances in view. It is therefore the main object of the present invention to provide a detachable inner sliding rail and server case mounting arrangement, which enables the inner sliding rail to be conveniently and detachably installed in the server case without tools.

It is another object of the present invention to provide a detachable inner sliding rail and server case mounting arrangement, which enables the inner sliding rail to be conveniently detached from the server case with less effort.

DETAILED DESCRIPTION OF THE INVENTION

Referring to FIGS. 1-15, a detachable inner sliding rail and server case mounting arrangement in accordance with the present invention is shown comprising a server case 2, and an inner sliding rail 1 (of a sliding rail assembly for server) detachably mounted in the server case 2. As illustrated, the inner sliding rail 1 comprises a plurality of hanger holes 11 spaced along the length thereof. The hanger holes 11 are shaped like a keyhole. Each hanger hole 11 comprises a large hole 112, and a narrow slot 111 adjoining the large hole 112. The server case 2 comprises a plurality of hangers 21 arranged at one side thereof corresponding to the hanger holes 11 of the inner sliding rail 1. Each hanger 21 comprises a shank 211 perpendicularly extended from the servers case 2, and a head 212 located at the distal end of the shank 211. The head 212 has a diameter smaller than the diameter of the large hole 112 but larger than the transverse width between two opposite lateral sidewalls 113 of the narrow slot 111. Thus, by means of aiming the large holes 112 of the hanger holes 11 of the inner sliding rail 1 at the heads 212 of the hangers 21 of the server case 2, the inner sliding rail 1 can be hung on the hangers 21. Further, a spring plate 3 and a stop member 4 are mounted at the inner sliding rail 1 adjacent to one hanger hole 11.

Figure 6:
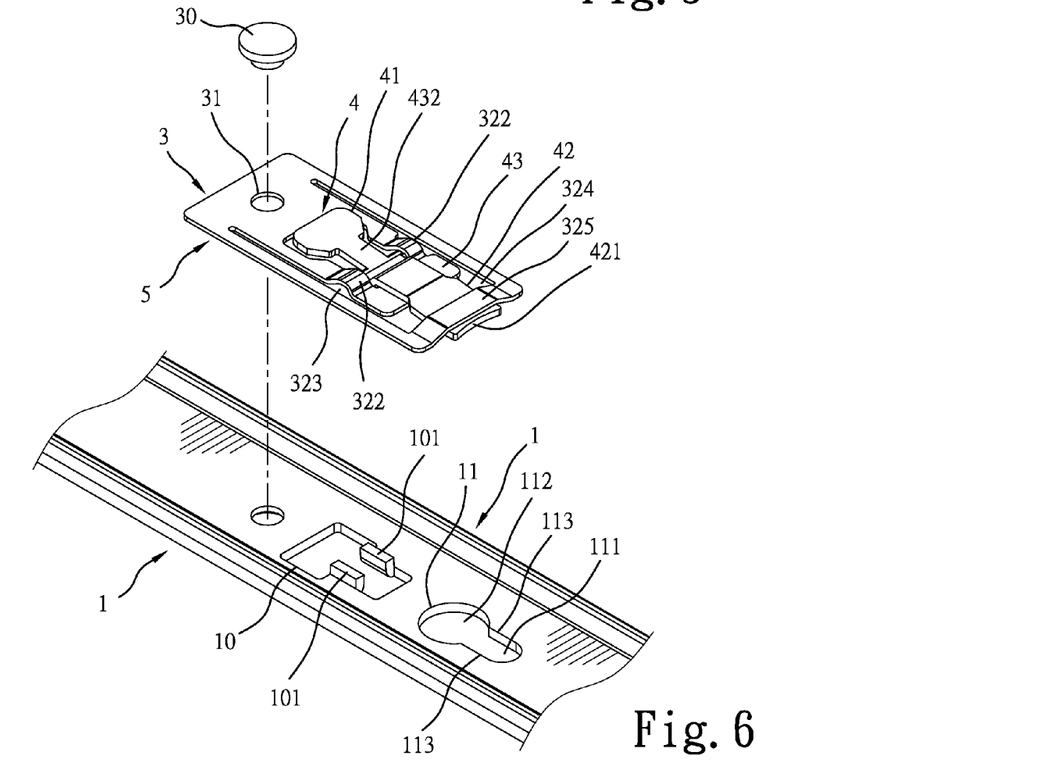
FIG. 6 is an exploded view of the component parts shown in FIG. 4.
Figure 7:
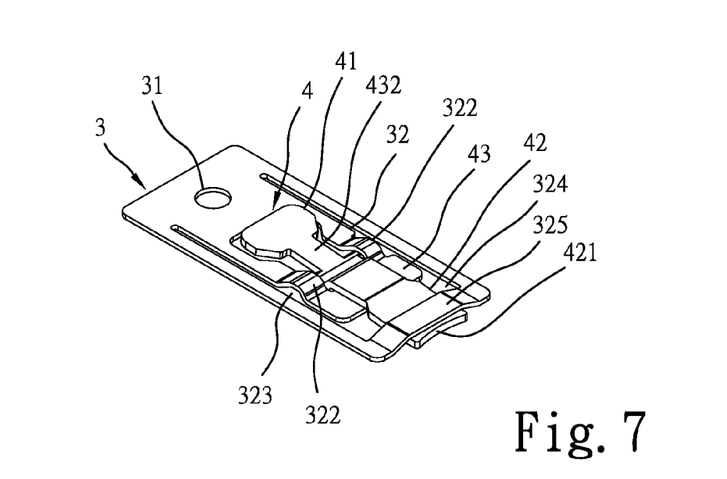
FIG. 7 is an elevational view of a part of the present invention, illustrating the stop plate coupled to the spring plate.
Figure 8:
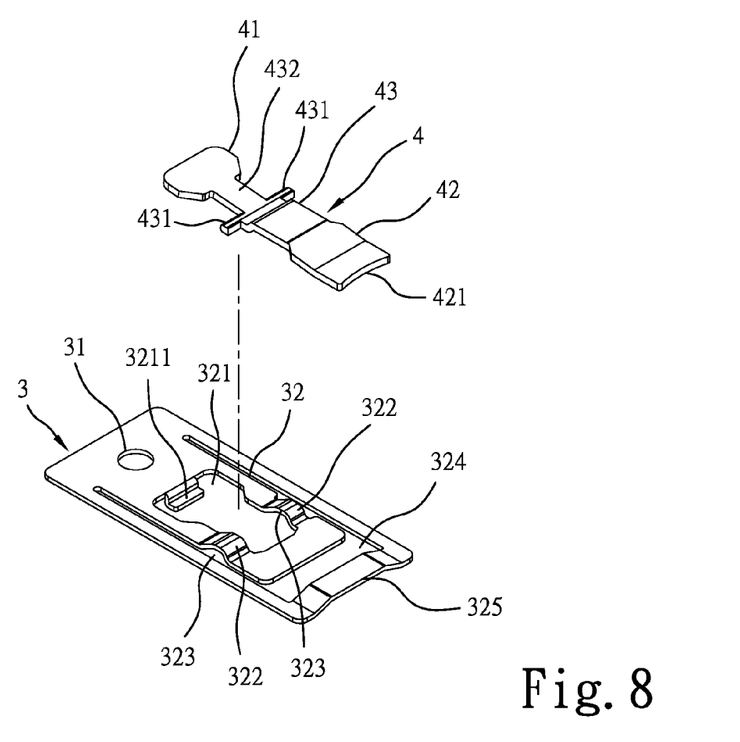
FIG. 8 is an exploded view of the component parts shown in FIG. 7.
Figure 9:
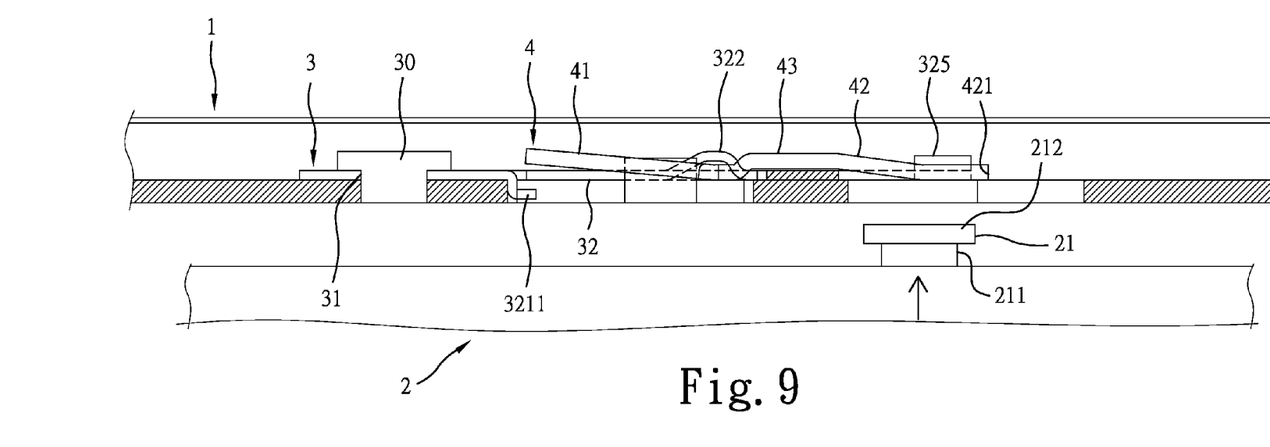
FIG. 9 is a schematic sectional view of a part of the present invention, illustrating one hanger hole of the inner sliding rail aimed at the respective hanger at the server case before coupling.
Figure 10:
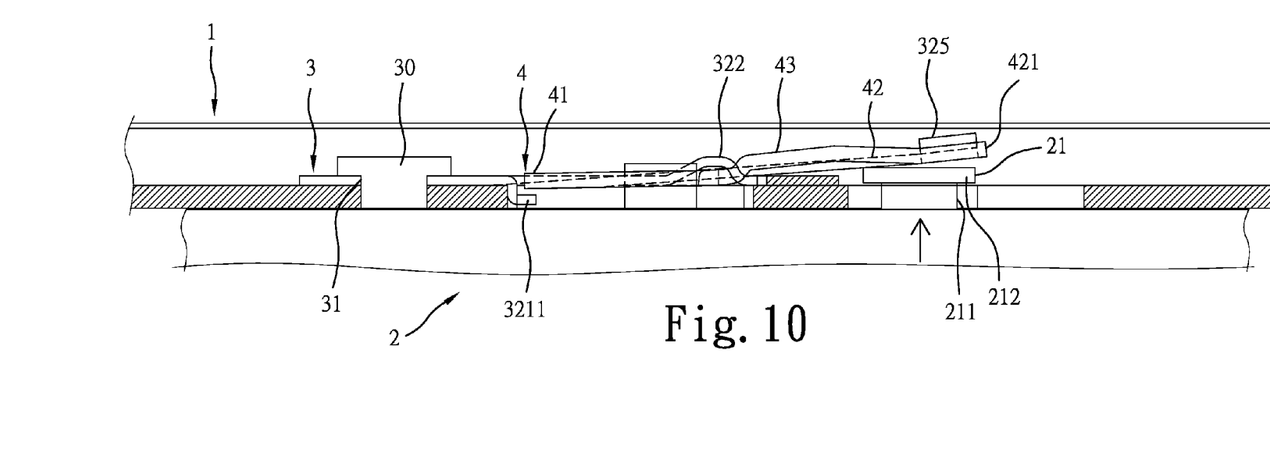
FIG. 10 corresponds to FIG. 9, illustrating the head of the hanger of the server case inserted through the respective hanger hole of the inner sliding rail and the spring plate curved.
Figure 11:
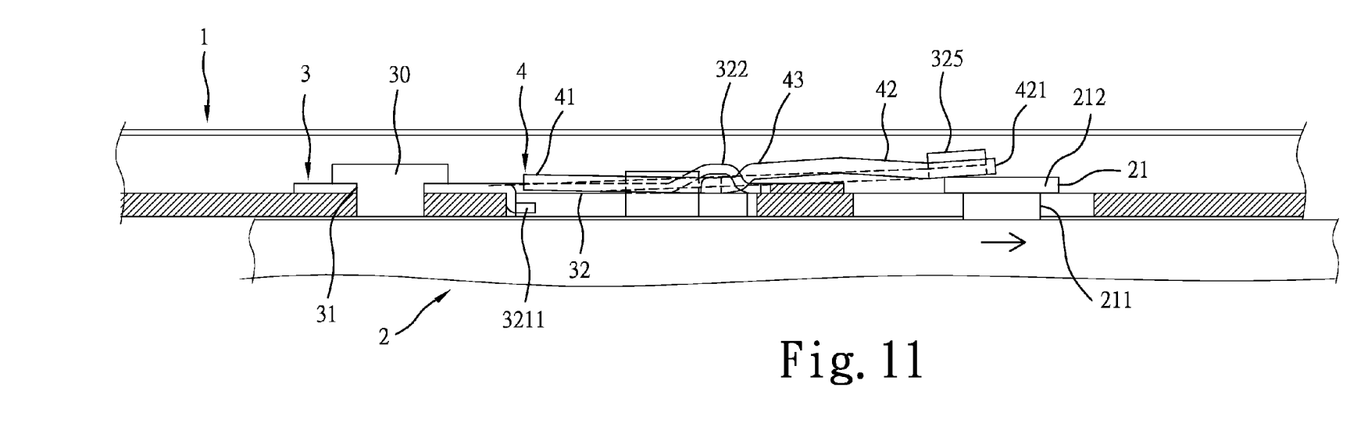
FIG. 11 corresponds to FIG. 10, illustrating the inner sliding rail moved horizontally relative to the server case.
Figure 12:
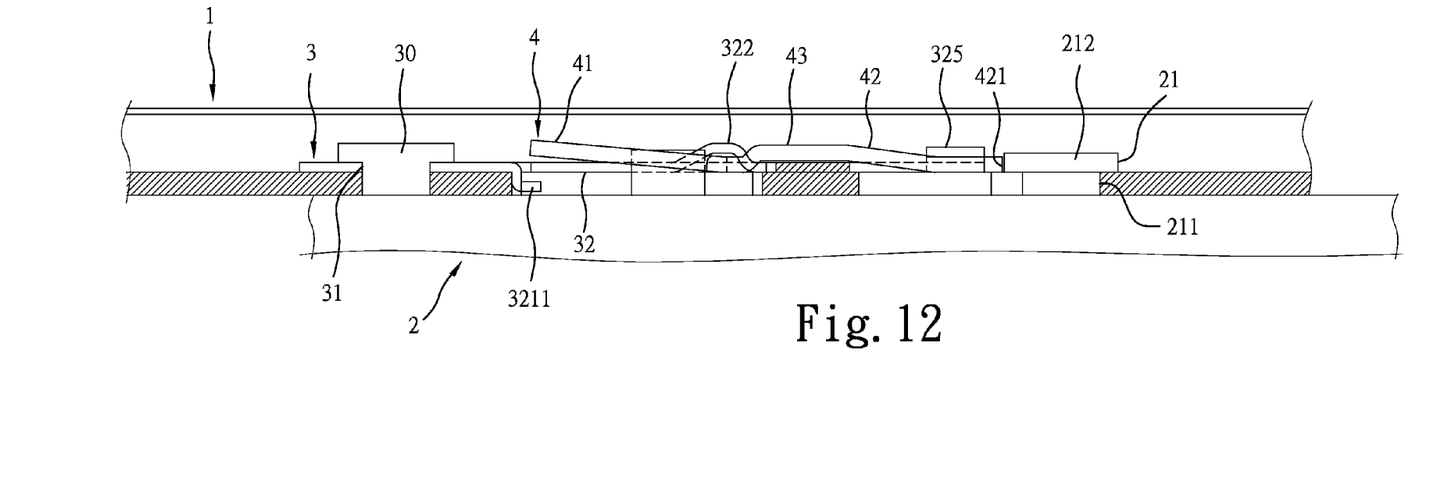
FIG. 12 corresponds to FIG. 11, illustrating the inner sliding rail locked to the server case.
Figure 13:
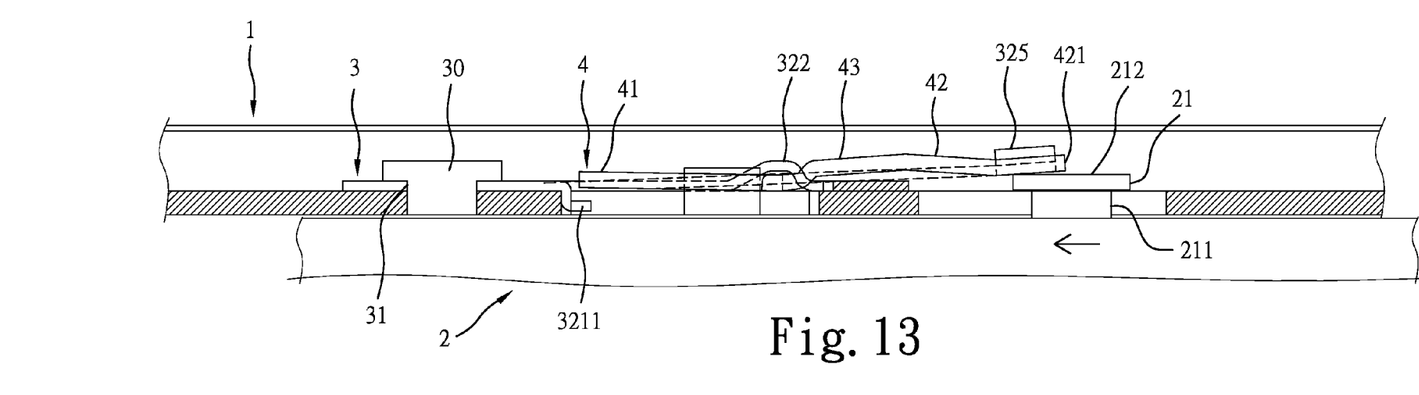
FIG. 13 corresponds to FIG. 12, illustrating the thumb plate of the stop member biased and the front end edge of the stop plate of the stop member disengaged from the head of the respective hanger.
Figure 14:
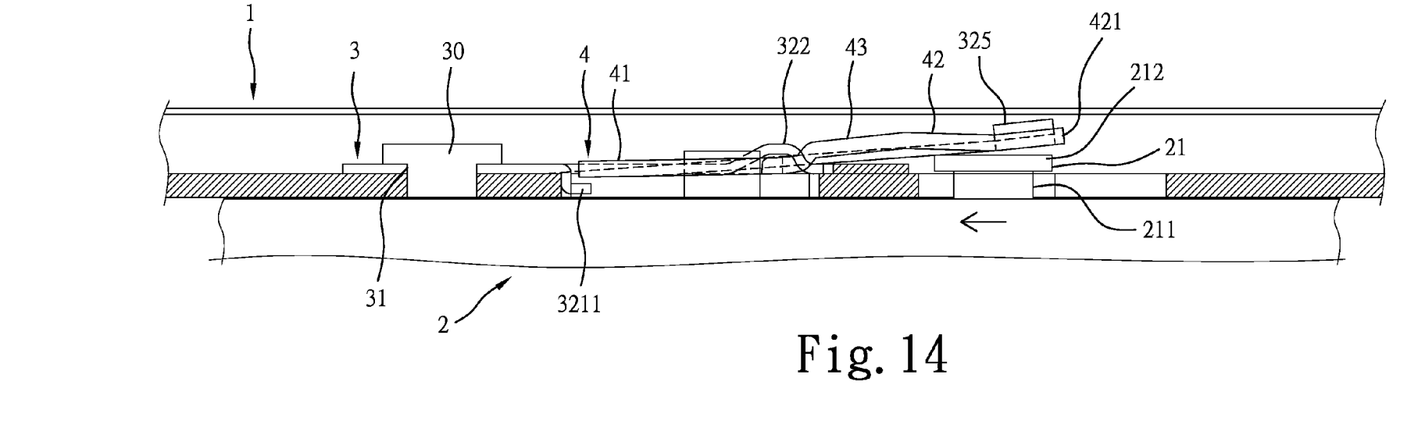
FIG. 14 corresponds to FIG. 13, illustrating the inner sliding rail moved horizontally relative to the server case to the unlocking position.
Figure 15:
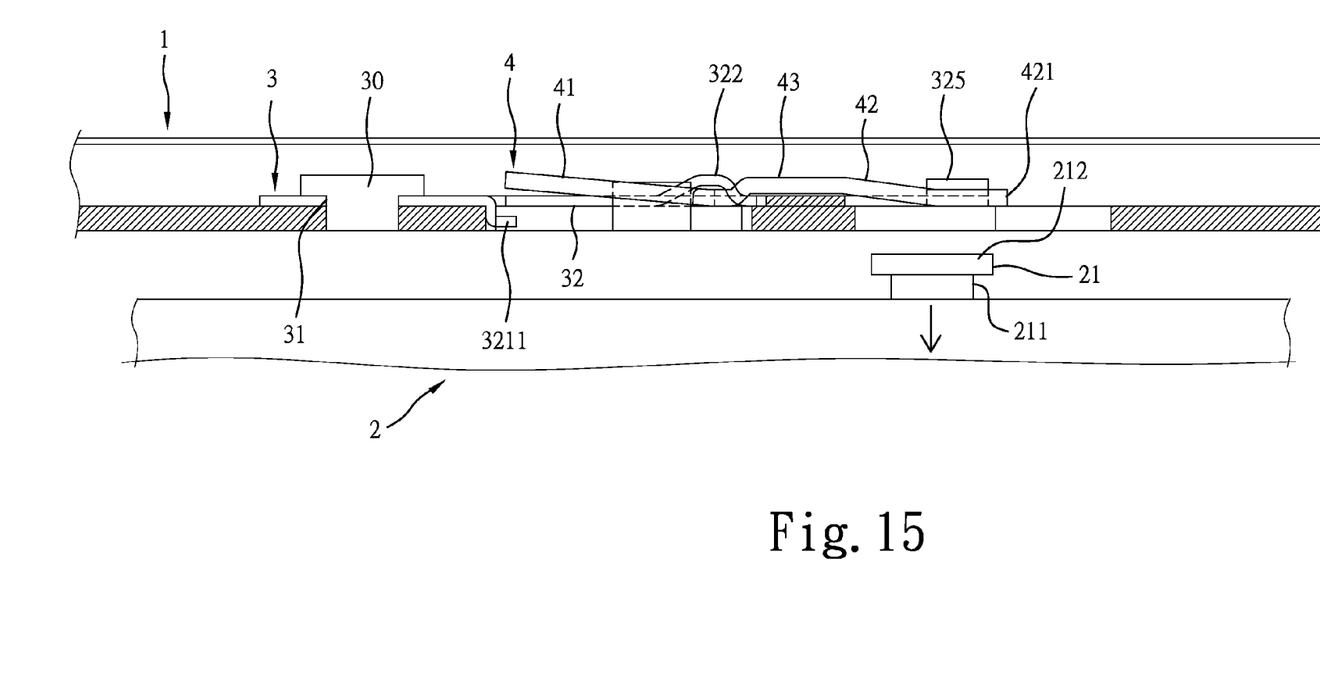
FIG. 15 corresponds to FIG. 14, illustrating the inner sliding rail detached from the server case.

As shown in FIGS. 7 and 8, the spring plate 3 comprises a mounting through hole 31 located at one end thereof and riveted to the inner sliding rail 1 with a rivet 30 (see FIGS. 5 and 6), a large opening 324 cut through opposing top and bottom walls thereof, a stop arm 325 transversely suspending at an opposite end thereof around the large opening 324 for stopping the stop member 4 in place, a frame plate 32 extended from a part thereof around the mounting through hole 31 in direction toward the stop arm 325 and suspending in the large opening 324, a small opening 321 cut through opposing top and bottom walls of the frame plate 32, two arched arms 322 bilaterally located at and formed of a part of the frame plate 32, and a coupling groove 323 defined in the bottom side of each arched arm 322.

The stop member 4 comprises a thumb plate 41 located at one end thereof, a stop plate 42 located at an opposite end thereof and set between the stop arm 325 of the spring plate 3 and the inner wall of the sliding rail 1 (see FIGS. 5 and 6), a coupling plate 43 connected between the thumb plate 41 and the stop plate 42, and two pivot rods 431 respectively extended from two opposite lateral sides of the coupling plate 43 in reversed directions and respectively pivotally coupled to the coupling grooves 323 of the spring plate 3.

The aforesaid inner sliding rail 1 further comprises an opening 10 (see FIGS. 5 and 6) through which the thumb plate 41 and coupling plate 43 of the stop member 4 can be biased by an external force in direction toward the inner sliding rail 1.

Further, the small opening 321 of the spring plate 3 is configured for the passing of the thumb plate 41 of the stop member 4, allowing the thumb plate 41 and coupling plate 43 of the stop member 4 to be biased by an external force in direction toward the inner sliding rail 1. The spring plate 3 further comprises a limiter plate 3211 extended from the frame plate 32 at one end of the small opening 321 and adapted to limit the pivoting range of the thumb plate 41 of the stop member 4 in direction toward the inner sliding rail 1.

The inner sliding rail 1 further comprises two stop blocks 101 respectively disposed at two opposite lateral sides of the opening 10 (see FIGS. 6 and 7). The coupling plate 43 of the stop member 4 comprises a neck portion 432 connected to the thumb plate 41 and stopped between the two stop blocks 101 of the inner sliding rail 1 to facilitate pivoting of the stop member 4.

When going to install the inner sliding rail 1 in the server case 2, aim the large holes 112 of the hanger holes 11 of the inner sliding rail 1 at the heads 212 of the respective hangers 21 of the server case 2 (see FIG. 9), and then attach the hanger holes 11 of the inner sliding rail 1 to the respective hangers 21 of the server case 2 to have the stop plate 42 of the stop member 4 be stopped against the head 212 of one hanger 21 of the server case 2. At this time, the stop member 4 is turned with the pivot rods 431 relative to the inner sliding rail 1 to force the stop plate 42 against the stop arm 325 of the spring plate 3, moving the stop arm 325 of the spring plate 3 in direction away from the inner sliding rail 1 (see FIG. 10). Thereafter, the user can move the inner sliding rail 1 horizontally (see FIG. 11) to couple the narrow slots 111 of the hanger holes 11 of the inner sliding rail 1 to the shanks 211 of the respective hangers 21 of the server case 2 and to have the opposite lateral sidewalls 113 of the narrow slots 111 of the hanger holes 11 be stopped by the heads 212 of the respective hangers 21 of the server case 2. At this time, the elastic potential energy of the stop arm 325 of the spring plate 3 pushes the stop member 4 back to its former position, forcing the front end edge 421 of the stop plate 42 of the stop member 4 into abutment against the head 212 of the respective hanger 21 (see FIG. 12) to prevent horizontal displacement of the inner sliding rail 1 relative to the server case 2. Thus, the assembling and locking operations of the inner sliding rail 1 and the server case 2 are done. Further, the inner sliding rail 1 can easily be dismounted from the server case 2 without any tool. At this time, press the thumb plate 41 of the stop member 4 to bias the pivot rods 431 of the stop member 4 relative to the inner sliding rail 1, moving the front end edge 421 of the stop plate 42 of the stop member 4 away from the head 212 of the respective hanger 21, and then move the inner sliding rail 1 horizontally relative to the server case 2 (see FIG. 13) to the extent where the large holes 112 of the hanger holes 11 are respectively aimed at the heads 212 of the respective hangers 21 of the server case 2 (see FIG. 14), allowing removal of the inner sliding rail 1 from the server case 2 (see FIG. 15).

In conclusion, the invention provides a detachable inner sliding rail and server case mounting arrangement, which has advantages and features as follows:

1. Detaching the inner sliding rail 1 from the server case 2 can easily be done without any tool by: pressing the thumb plate 41 of the stop member 4 to bias the pivot rods 431 of the stop member 4 relative to the inner sliding rail 1 and to further move the front end edge 421 of the stop plate 42 of the stop member 4 away from the head 212 of the respective hanger 21, and then moving the inner sliding rail 1 horizontally relative to the server case 2 to the extent where the large holes 112 of the hanger holes 11 are respectively aimed at the heads 212 of the respective hangers 21 of the server case 2, and then moving the inner sliding rail 1 directly away from the server case 2.

2. It is easy to install the inner sliding rail 1 in the server case 2 with no tools.

What is claimed is:

1. A detachable inner sliding rail and server case mounting arrangement, comprising:

a server case comprising a plurality of hangers arranged in a line at one side thereof, each said hanger comprising a shank perpendicularly extended from said server case and a head located at a distal end of said shank;

an inner sliding rail attachable to said hangers of said server case, said inner sliding rail comprising a plurality of hanger holes spaced along the length thereof, each said hanger hole comprising a large hole and a narrow slot adjoining said large hole, said large hole having a diameter larger than the diameter of said head of each said hanger, said narrow slot having a width smaller than the diameter of said head of each said hanger;

a spring plate affixed to said inner sliding rail adjacent to one said hanger hole; and a stop member pivotally coupled to said spring plate and adapted to lock said inner sliding rail to said server case after said inner sliding rail having been attached to said hangers;

wherein:

said spring plate comprises a mounting through hole located at one end thereof and riveted to said inner sliding rail with a rivet, a large opening cut through opposing top and bottom walls thereof, a stop arm transversely suspending at an opposite end thereof around said large opening for stopping said stop member in place, a frame plate extended from a part thereof around said mounting through hole in direction toward said stop arm and suspending in said large opening, a small opening cut through opposing top and bottom walls of said frame plate, two arched arms bilaterally located at and formed of a part of said frame plate, and a coupling groove defined in a bottom side of each said arched arm;

said stop member comprises a thumb plate located at one end thereof, a stop plate located at an opposite end thereof and set between said stop arm of said spring plate and an inner wall of said sliding rail, a coupling plate connected between said thumb plate and said stop plate, and two pivot rods respectively extended from two opposite lateral sides of said coupling plate in reversed directions and respectively pivotally coupled to the coupling grooves of said spring plate for enabling said stop member to be biased relative to said inner sliding rail between a locking position to lock said inner sliding rail to said hangers of said server case and an unlocking position to unlock said inner sliding rail from said hangers of said server case;

said inner sliding rail further comprises an opening through which said thumb plate of said stop member is biasable by an external force in direction toward said inner sliding rail.

2. The detachable inner sliding rail and server case mounting arrangement as claimed in claim 1, wherein said small opening of said spring plate is configured for the passing of said thumb plate of said stop member, allowing said thumb plate of said stop member to be biased by an external force in direction toward said inner sliding rail.

3. The detachable inner sliding rail and server case mounting arrangement as claimed in claim 2, wherein said spring plate further comprises a limiter plate extended from said frame plate at one end of said small opening and adapted to limit the pivoting range of said thumb plate of said stop member in direction toward said inner sliding rail.

4. The detachable inner sliding rail and server case mounting arrangement as claimed in claim 1, wherein said inner sliding rail further comprises two stop blocks respectively disposed at two opposite lateral sides of the opening of said inner sliding rail; said coupling plate of said stop member comprises a neck portion connected to said thumb plate and stopped between said two stop blocks of said inner sliding rail.

* * * * *